(12) United States Patent
Yuan et al.

(10) Patent No.: US 12,272,304 B2
(45) Date of Patent: Apr. 8, 2025

(54) DISPLAY PANEL, DISPLAY DRIVING METHOD AND DISPLAY DEVICE

(71) Applicant: HKC CORPORATION LIMITED, Shenzhen (CN)

(72) Inventors: Xin Yuan, Shenzhen (CN); Xiufeng Zhou, Shenzhen (CN); Chen Chen, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/514,717

(22) Filed: Nov. 20, 2023

(65) Prior Publication Data

US 2024/0428729 A1  Dec. 26, 2024

(30) Foreign Application Priority Data

Jun. 20, 2023 (CN) .......................... 202310738317.4

(51) Int. Cl.
  *G09G 3/3225* (2016.01)
  *H10K 59/131* (2023.01)

(52) U.S. Cl.
  CPC ......... *G09G 3/3225* (2013.01); *H10K 59/131* (2023.02); *G09G 2300/0439* (2013.01);
  (Continued)

(58) Field of Classification Search
  CPC ......... G09G 3/3225; G09G 2300/0439; G09G 2300/0469; G09G 2300/0842; G09G 2310/08; G09G 2320/068; G09G 2358/00; G09G 2320/028; G09G 3/3648; G09G 2300/0452; G09G 2300/0443; G09G 3/3233; G09G 2300/0447;
  (Continued)

(56) References Cited

U.S. PATENT DOCUMENTS

| 11,335,249 B1 * | 5/2022 | Ma ....................... G09G 3/3225 |
| 2011/0157122 A1 * | 6/2011 | Tsai .................... H10K 59/1315 |
| | | 345/80 |

(Continued)

FOREIGN PATENT DOCUMENTS

| CN | 111312162 | 6/2020 |
| CN | 115273661 | 11/2022 |

(Continued)

OTHER PUBLICATIONS

CNIPA, First Office Action for CN Application No. 202310738317. 4, Mar. 10, 2024.

*Primary Examiner* — Matthew A Eason
*Assistant Examiner* — Sujit Shah
(74) *Attorney, Agent, or Firm* — Hodgson Russ LLP

(57) ABSTRACT

A display driving method for driving a display panel, the display driving method includes acquiring a display mode of the display panel, the display mode including an anti-view mode and a wide viewing angle mode; and controlling a control line to output a control signal to turn on anti-view sub-pixels when the display mode of the display panel is determined as the anti-view mode; and controlling a first power branch line and a second power branch line to output signals with opposite waveforms when the display mode of the display panel is determined as a flashing anti-view mode.

3 Claims, 5 Drawing Sheets

(52) U.S. Cl.
    CPC ............... *G09G 2300/0469* (2013.01); *G09G 2300/0842* (2013.01); *G09G 2310/08* (2013.01); *G09G 2320/068* (2013.01); *G09G 2358/00* (2013.01)

(58) Field of Classification Search
    CPC ... G09G 2320/0233; G09G 2320/0626; H01K 59/131; G02F 1/1323; G02F 1/134309; G02F 1/134381; G02F 1/133707; G02F 1/1337; G02F 1/13471; G02F 1/133528; G02F 1/134345; G02F 1/133512; G02F 1/1368; G02F 1/13306; G02F 1/133753; G02F 1/1343; G02F 1/134336; G02F 1/133626; G02F 1/133603; G06F 3/0412; H10K 59/50; H10K 59/12; H10K 59/352
    See application file for complete search history.

(56) References Cited

U.S. PATENT DOCUMENTS

| | | | | |
|---|---|---|---|---|
| 2022/0157233 | A1* | 5/2022 | Zheng | G09G 3/3208 |
| 2022/0199712 | A1* | 6/2022 | Park | H10K 59/873 |
| 2023/0209883 | A1* | 6/2023 | Ji | H10K 59/352 |
| | | | | 345/174 |

FOREIGN PATENT DOCUMENTS

| | | |
|---|---|---|
| CN | 115843199 | 3/2023 |
| CN | 116206558 | 6/2023 |
| WO | 2013061599 | 5/2013 |

\* cited by examiner

DISPLAY PANEL, DISPLAY DRIVING METHOD AND DISPLAY DEVICE

CROSS-REFERENCE TO RELATED APPLICATIONS

This application claims priority to Chinese Patent Application No. 202310738317.4, filed Jun. 20, 2023, the entire disclosure of which is incorporated herein by reference.

TECHNICAL FIELD

The present application relates to the field of display, and more particularly, to a display panel, a display driving method and a display device.

BACKGROUND

OLED (Organic Light-Emitting Diode) display panels have the advantages of being self-luminous, bendable, thin, high brightness, low power consumption, fast response and wide color gamut, and are widely used in electronic products such as TVs, mobile phones and notebooks. Display panel has a wider viewing angle, which can bring better visual experience to users, but sometimes users also want the display panel capable of anti-viewing, thus effectively protecting trade secrets and personal privacy.

In order to conveniently switch the anti-view function, pixel cells of some display panels are provided with anti-view pixels. After the anti-view pixels are turned on, when viewed obliquely, the light emitted by the anti-view pixels interferes with the light of the display pixels, to achieve anti-viewing when viewed obliquely. When viewed orthogonally, the light emitted by the anti-view pixel is blocked, to achieve normal display. After the anti-view pixel is turned off, the display panel can display normally.

However, all anti-view pixels are turned on or off at the same time. When the anti-view pixels are turned on, the anti-view effect of the display panel is poor.

SUMMARY

There are provided a display panel, a display driving method and a display device according to embodiments of the present disclosure. The technical solution is as below.

According to a first aspect of embodiments of the present application, there is provided a display panel, which includes:
a base substrate;
a plurality of pixel cells arranged on the base substrate, the plurality of pixel cells being arranged in arrays in a row direction and a column direction, wherein at least part of the plurality of pixel cells include anti-view sub-pixels, each of the anti-view sub-pixels comprising a first anode, an anti-view light-emitting part and a cathode;
a first pixel driving circuit, a control line, a first power line and a second power line, the first pixel driving circuit being coupled to the control line, the first power line and the first anode, and the cathode being connected to the second power line;
wherein at least part of the anti-view sub-pixels have different areas of orthographic projection of the anti-view light-emitting parts on the base substrate, so that brightness of the at least part of the anti-view sub-pixels is different.

According to a second aspect of embodiments of the present application, there is provided a display driving method for driving the display panel, the display panel includes a base substrate and a plurality of pixel cells arranged on the base substrate, the plurality of pixel cells being arranged in arrays in a row direction and a column direction, at least part of the plurality of pixel cells include anti-view sub-pixels; at least part of the anti-view light-emitting parts have different areas of orthographic projection on the base substrate; each of the anti-view sub-pixels includes a first anode, an anti-view light-emitting part and a cathode; and the display panel further includes a first transistor, a control line, a first power line and a second power line, a control terminal of the first transistor being connected the control line, a first terminal of the first transistor being connected to the first power line, a second terminal of the first transistor being connected to the first anode, and the cathode being connected to the second power line; the display driving method includes:
acquiring a display mode of the display panel, the display mode including an anti-view mode and a wide viewing angle mode; and
controlling the control line to output a control signal to turn on the anti-view sub-pixels when the display mode of the display panel is determined as the anti-view mode.

According to a second aspect of embodiments of the present application, there is provided a display device including:
the display panel; and
a main board connected to the display panel.

It should be understood that the above general description and the following detailed description are exemplary and explanatory only and are not intended to limit the present disclosure.

BRIEF DESCRIPTION OF DRAWINGS

The accompanying drawings, which are incorporated in and constitute a part of the description, illustrate embodiments consistent with the present application and, together with the description, serve to explain the principles of the present application. It will be apparent that the drawings described below are only some embodiments of the present application, and other drawings may be obtained from them without creative effort for those of ordinary skill in the art.

DESCRIPTION OF THE EMBODIMENTS

The exemplary embodiments will now be described more fully with reference to the accompanying drawings. However, the example embodiments can be implemented in a variety of forms and should not be construed as being limited to the examples set forth herein. Rather, these embodiments are provided so that the present application will be more comprehensive and complete, and the concept of exemplary embodiments will be fully communicated to those skilled in the art.

Further, the described features, structures or characteristics may be incorporated in any suitable manner in one or more embodiments. In the following description many specific details are provided to give a full understanding of the embodiments of the present application. However, those skilled in the art will appreciate that the technical aspects of the present application may be practiced without one or more of the specific details, or other methods, components, devices, steps and the like may be employed. In other instances, the common methods, devices, implementations or operations are not shown or described in detail to avoid obscuring aspects of the present application.

The present application is described in further detail below in conjunction with the accompanying drawings and specific embodiments. It should be noted that the technical features involved in the different embodiments of the present application described below can be combined mutually in case of no conflict. The following embodiments described with reference to the drawings are illustrative and only used to explain the present application, but may not be interpreted as the restrictions of the present application.

Embodiment I

Figure 1:
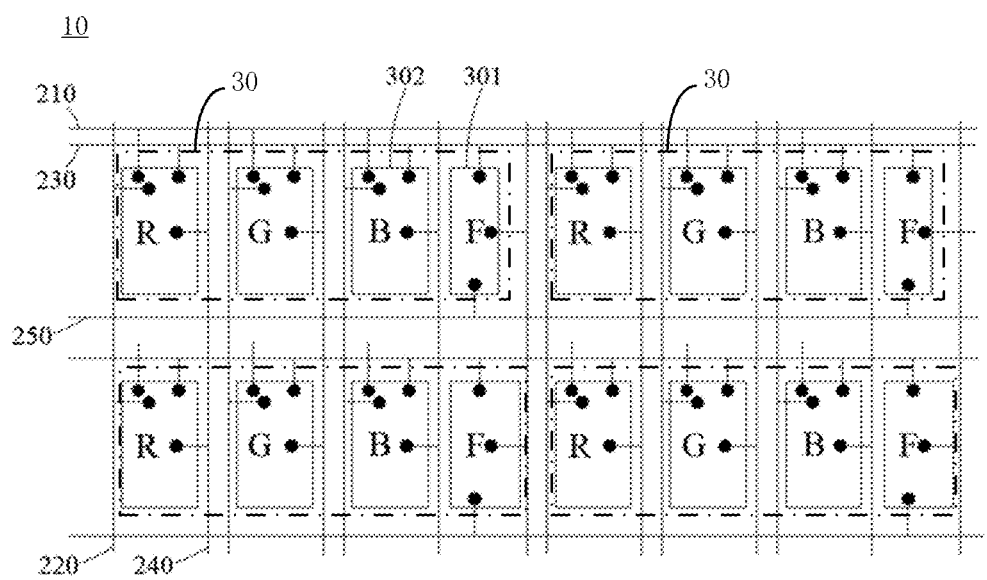
FIG. 1 is a planar structural diagram of a display panel in Embodiment I of the present application.
Figure 2:
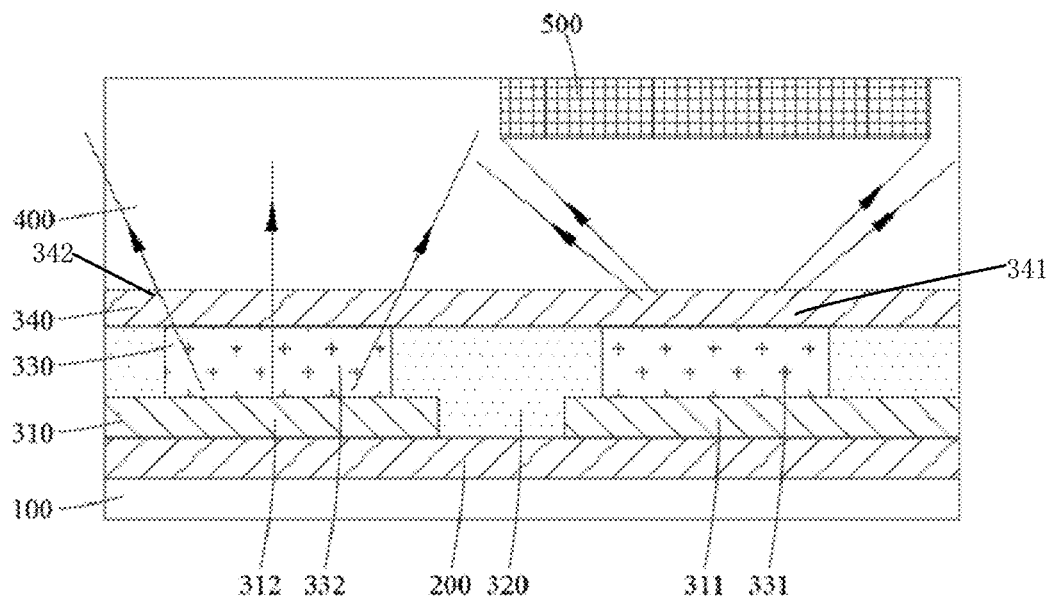
FIG. 2 is a sectional structural diagram of the sectional structure of the display panel in Embodiment I of the present application.
Figure 3:
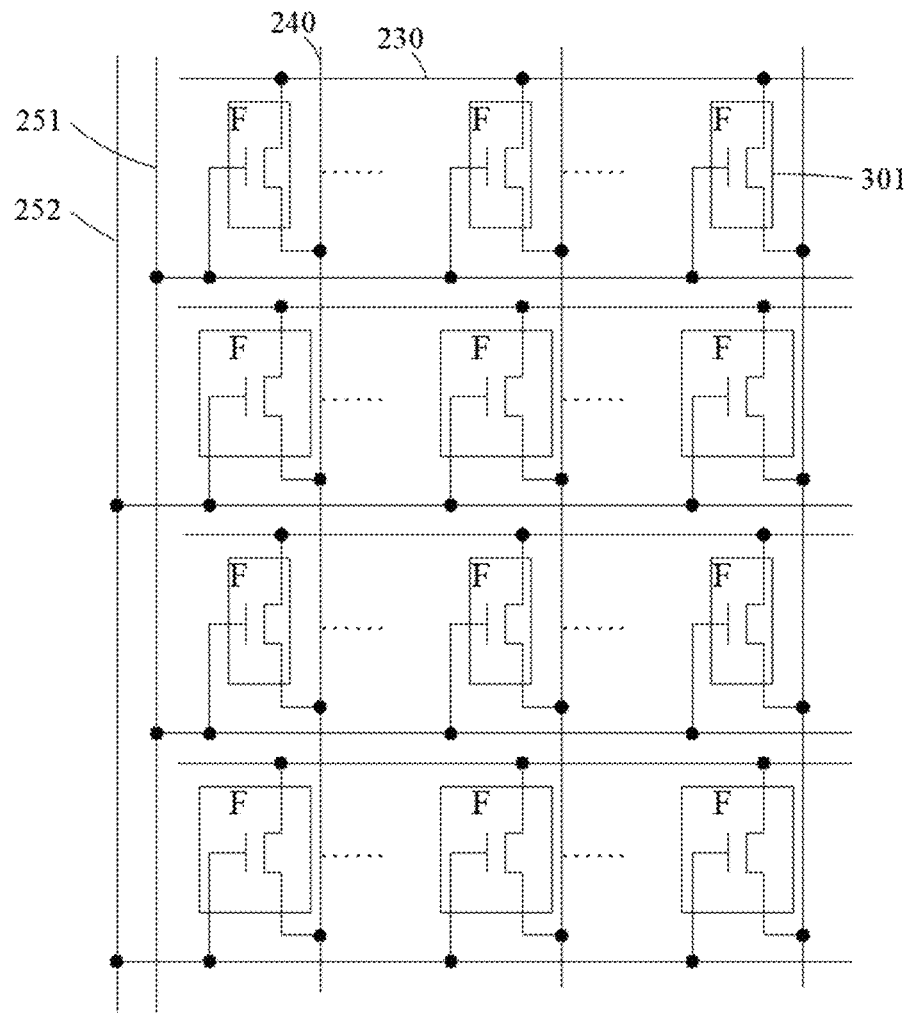
FIG. 3 is a planar structure diagram of an anti-view sub-pixel in Embodiment I of the present application.
Figure 4:
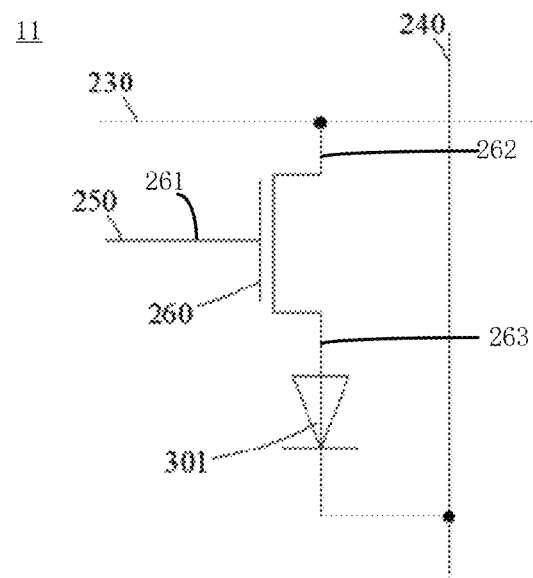
FIG. 4 is a structural diagram of a first pixel driving circuit in Embodiment I of the present application.
Figure 5:
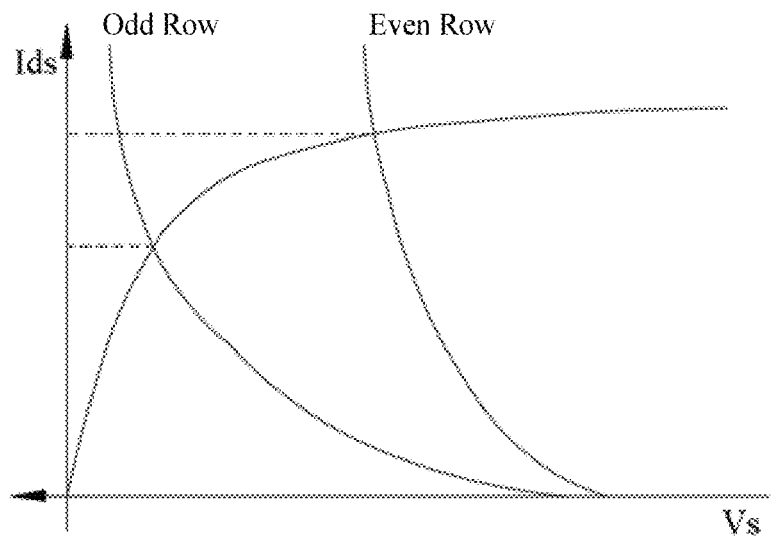
FIG. 5 is a schematic diagram of a driving current of a first transistor in Embodiment I of the present application.

Referring to FIGS. 1 to 3, the display panel 10 in this embodiment includes a base substrate 100 and a plurality of rows of scan lines 210, a plurality of columns of data lines 220 and a plurality of pixel cells 30 on one side of the base substrate 100, and the pixel cells 30 are arranged in arrays in a row direction and a column direction provided. At least part of the pixel cells 30 includes at least one anti-view sub-pixel 301 (F). The anti-view sub-pixel 301 includes a first anode 311, an anti-view light-emitting part 331 and a cathode 341. The anti-view light-emitting part 331 can be made of an organic light-emitting material emitting red light, green light, blue light, yellow light or white light. Each pixel cell 30 includes at least one display sub-pixel 302, and each display sub-pixel 302 is correspondingly connected to the scan line 210 of the corresponding row and the data line 220 of the corresponding column. The display sub-pixel 302 includes a second anode 312, a display light-emitting part 332 and a cathode 342. A cathode 341 of the anti-view sub-pixel 301 and a cathode 342 of the display sub-pixel 302 are integrated.

In this embodiment, the pixel cell 30 may include a plurality of display sub-pixels 302 with different colors, namely, the display light-emitting parts 332 of some display sub-pixels 302 are made of the organic light-emitting material emitting red light to form red display sub-pixels 302 (R), the display light-emitting parts 332 of some display sub-pixels 302 are made of the organic light-emitting material emitting green light to form green display sub-pixels 302 (G), and the display light-emitting parts 332 of some display sub-pixels 302 are made of the organic light-emitting material emitting blue light to form the blue display sub-pixels 302 (B), thereby achieving RGB display.

The display panel 10 further includes a first pixel driving circuit 11 for driving the anti-view sub-pixel 301, a second pixel driving circuit for driving the display sub-pixel 302, a first power line 230, a second power line 240, and a control line 250. The first pixel driving circuit is coupled to the control line 250, the first power line 230 and the first anode 311, the cathode 341 is connected to the second power line 240, and the second pixel driving circuit is coupled to the scan line 210, the data line 220, the first power line 230, and the second anode 312.

At least some of the anti-view sub-pixels 301 have different areas of orthographic projection of the anti-view light-emitting part 331 on the base substrate 100 so that the brightness of at least some of the anti-view sub-pixels 301 is different.

The display panel 10 includes a base substrate 100, and a driving circuit layer 200, an anode layer 310, a pixel define layer 320, a light-emitting layer 330, a cathode layer 340, an encapsulation layer 400, and a light shielding layer 500 that are sequentially formed on the base substrate 100. The scan line 210, the data line 220, the first power line 230, the second power line 240, the control line 250, the first pixel driving circuit 11 and the second pixel driving circuit 12 may all be located in the driving circuit layer 200. The first anode 311 and the second anode 312 are both located in the anode layer 310, and the anti-view light-emitting part 331 and the display light-emitting part 332 are both located in the light-emitting layer 330. The cathode 341 of the anti-view sub-pixel 301 and the cathode 342 of the display sub-pixel 302 are both located in the cathode layer 340.

The anti-view light-emitting part 331 and the display light-emitting part 332 are located in different pixel openings of the pixel define layer 320. The anti-view light-emitting part 331 is connected to the first anode 311, and the display light-emitting part 332 is connected to the second anode 312. The cathode layer 340 covers the anti-view light-emitting part 331, the display light-emitting part 332 and the pixel define layer 320. The orthographic projection of the anti-view light-emitting part 331 on the base substrate 100 is within the orthographic projection of the light shielding layer 500 on the base substrate 100, that is, the light shielding layer 500 shields the forward light emitted from the anti-view light-emitting part 331.

When the anti-view sub-pixel 301 is turned on, the light emitted from the anti-view sub-pixel 301 interferes with the light of the display sub-pixel 302 when viewed obliquely, so as to realize narrow viewing angle display, that is, to realize anti-viewing when viewed obliquely. When viewed orthogonally, the light emitted by the anti-view sub-pixel 301 is blocked, and normal display is realized. After the anti-view sub-pixel 301 is turned off, the display panel 10 can be displayed in a wide viewing angle, that is, normally displayed. However, all the anti-view sub-pixels 301 are turned on or off at the same time. When the anti-view sub-pixels 301 are all turned on, the brightness of all the anti-view sub-pixels 301 is consistent, and the anti-view effect of the display panel is poor.

In this embodiment, a scan line 210, a data line 220 and a plurality of pixel cells 30 are arranged at one side of the base substrate 100. At least part of the pixel cells 30 include at least one anti-view sub-pixel 301, the anti-view sub-pixel 301 includes a first anode 311, an anti-view light-emitting part 331 and a cathode 341. The first pixel driving circuit 11 is coupled with a control line 250, a first power line 230 and the first anode 311, and the cathode 341 is connected to a second power line 240, at least part of the anti-view sub-pixels 301 have different areas of orthographic projection of the anti-view light-emitting parts 331 on the base substrate 100, so that brightness of the at least part of the anti-view sub-pixels 301 is different. That is to say, there are brightness changes in anti-view sub-pixels 301, which not only interfere with the acquisition of display content when viewed obliquely, but also is more likely to cause visual fatigue when viewed obliquely, which enhances the anti-view effect of display panel.

It should be noted that the pixel cell 30 includes a red display sub-pixel 302, a green display sub-pixel 302, a blue display sub-pixel 302, and an anti-view sub-pixel 301. The red display sub-pixel 302, the green display sub-pixel 302, the blue display sub-pixel 302, and the anti-view sub-pixel 301 may be arranged in sequence in the row direction as shown in the figures, but are not limited thereto, and the positions of the red display sub-pixel 302, the green display sub-pixel 302, the blue display sub-pixel 302, and the anti-view sub-pixel 301 may also be interchanged or arranged in other shapes, depending on the specific situation.

As an example, as shown in FIGS. 2 to 5, the area of the orthographic projection of the anti-view light-emitting parts 331 in the odd row on the base substrate 100 is smaller than the area of the orthographic projection of the anti-view light-emitting parts 331 in the even row on the base substrate 100. That is, the brightness of the anti-view sub-pixels 301 in the odd row is lower than that of the anti-view sub-pixels 301 in the even row. The first pixel driving circuit 11 includes a first transistor 260, a control terminal 261 of the first transistor 260 is connected to the control line 250, a first terminal 262 of the first transistor 260 is connected to the first power line 230, and a second terminal 263 of the first transistor 260 is connected to the first anode 311. The control terminal, the first terminal 262 and the second terminal 263 of the first transistor 260 may be gate, drain and source thereof, respectively.

The first transistor 260 is a driving transistor for the anti-view sub-pixel 301. The gate-source voltage difference of the first transistor 260 determines a turn-on degree of the first transistor 260, that is, the signal of the control line 250 determines a turn-on degree of the first transistor 260. The greater the turn-on degree of the first transistor 260, the greater the source voltage Vs of the first transistor 260, the greater the driving current Ids, and the higher the brightness of the anti-view sub-pixel 301. Meanwhile, the larger the area of the anti-view light-emitting part 331, the larger the source voltage Vs of the first transistor 260, and the larger the driving current Ids, the higher the brightness of the anti-view sub-pixel 301.

The brightness of the anti-view sub-pixels 301 in the odd row is different from that of the anti-view sub-pixels 301 in the even row, and the display picture formed by the anti-view sub-pixels 301 is a stripe picture with brightness changes, which interferes with the acquisition of display content when viewed obliquely, and at the same time, it is easier to cause visual fatigue when viewed obliquely, that is, which enhances the anti-view effect of the display panel.

It should be noted that the area of the orthographic projection of the anti-view light-emitting parts 331 in the odd row on the base substrate 100 may be smaller than the area of the anti-view light-emitting parts 331 in the even row on the base substrate 100, but not limited thereto, and the area of the orthographic projection of the anti-view light-emitting parts 331 in the odd column on the base substrate 100 may be smaller than the area of the anti-view light-emitting parts 331 in the even column on the base substrate 100, depending on the specific situation.

Figure 6:
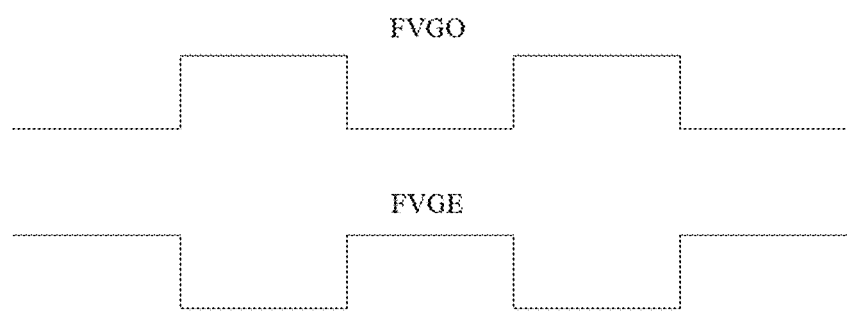
FIG. 6 is a schematic diagram of control signals of a first control line and a second control line in Embodiment I of the present application.

Referring to FIGS. 3 and 6, the control line 250 includes a first control line 251 and a second control line 252, a control terminal 261 of the first transistor 260 in the odd row is connected to the first control line 251, and a control terminal 261 of the first transistor 260 in even row is connected to the second control line 252.

The signal (FVGO) of first control line 251 and the signal (FVGE) of the second control line 252 may both be PWM (Pulse Width Modulation) wave signals, and the periods of the signal of the first control line 251 and the signal of second control line 252 are both two frames. The high-level voltage of the signal of first control line 251 is 7V, the low-level voltage of the signal of the first control line 251 is −7V, and the ratio of the high level of the signal of the first control line 251 to the low level of the signal of the first control line 251 is 1. The high-level voltage of the signal of the second control line 252 is 7V, the low-level voltage of the signal of the second control line 252 is −7V, and the ratio of the high level of the signal of the second control line 252 to the low level of the signal of the second control line 252 is 1. The waveforms of the signal of the first control line 251 and the signal of second control line 252 are opposite, that is, when the signal of the first control line 251 is high, the signal of second control line 252 is low, and when the signal of first control line 251 is low, the signal of the second control line 252 is high.

Since the control terminal 261 of the first transistor 260 in the odd row is connected to the first control line 251, and the control terminal 261 of the first transistor 260 in the even row is connected to the second control line 252, the control lines 250 in the odd row and the even row can output control signals with opposite waveforms, so that the anti-view sub-pixels 301 in the odd row and the even row not only have different brightness, but also flash alternately. This design can cause visual fatigue when viewed obliquely, that is, enhance the anti-view effect of the display panel.

It should be noted that the periods of the signal of the first control line 251 and the signal of the second control line 252, the high-level voltage and the low-level voltage, and the ratio of the high-level and the flat-voltage can be set depending on the situation.

In some embodiments, the high-level voltage of the signal of the first control line 251 and the high-level voltage of the signal of the second control line 252 may also be different. For example, the high-level voltage of the signal of first control line 251 is 4V, and the high-level voltage of the signal of the second control line 252 is 6V.

The first transistor 260 is a driving transistor for the anti-view sub-pixel 301. The gate-source voltage difference of the first transistor 260 determines a turn-on degree of the first transistor 260, that is, the signal of the control line 250 determines a turn-on degree of the first transistor 260. The greater the turn-on degree of the first transistor 260, the greater the source voltage Vs of the first transistor 260, the greater the driving current Ids, and the higher the brightness of the anti-view sub-pixel 301.

If the high-level voltage of the signal of the first control line 251 and the high-level voltage of the signal of the second control line 252 may also be different, the brightness of the anti-view sub-pixels 301 in the odd row may be adjusted by the signal of the first control line 251, and the brightness of the anti-view sub-pixels 301 in the even row may be adjusted by the signal of the second control line 252, so that the brightness difference between the anti-view sub-pixels 301 in the odd row and the anti-view sub-pixels 301 in the even row may be increased or decreased, so as to enhance the anti-view effect of the display panel 10. Specifically, the brightness difference between the anti-view sub-pixels 301 in the odd row and the anti-view sub-pixels 301 in the even row is increased or decreased depending on the fact that whichever visual fatigue is more likely to occur.

Figure 7:
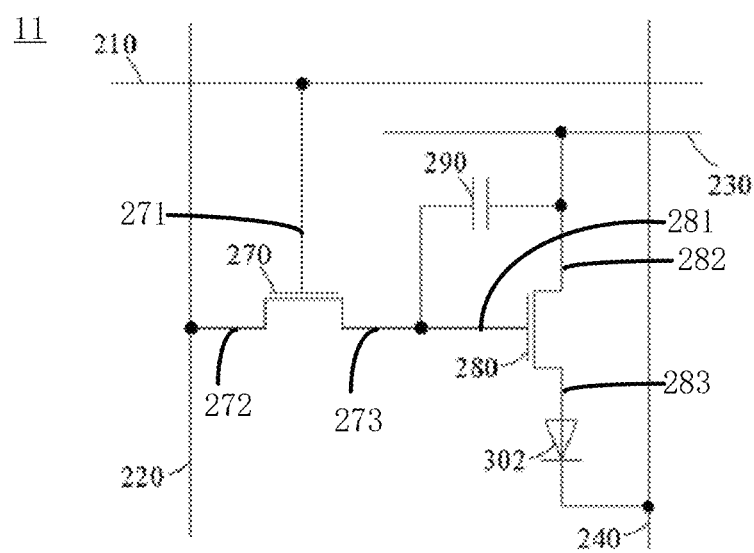
FIG. 7 is a structural diagram of a second pixel driving circuit in Embodiment I of the present application.

Referring to FIG. 7, the second pixel driving circuit 12 includes a second transistor 270 and a third transistor 280. A control terminal 271 of the second transistor 270 is connected to the scan line 210, a first terminal 272 of the second transistor 270 is connected to the data line 220, a second terminal 273 of the second transistor 270 is connected to a control terminal 281 of the third transistor 280. A first terminal 282 of the third transistor 280 is connected to the first power line 230, a second terminal 283 of the third transistor 280 is connected to the second anode 312, and a cathode 342 of the display sub-pixel 302 is connected to the second power line 240. That is, the display sub-pixel 302 and the anti-view sub-pixel 301 share a power line. The voltage of the first power line 230 may be 6V, and the voltage of the second power line 240 may be 0V. The control terminals, the first terminals and the second terminals of the second transistor 270 and the third transistor 280 may be their gate, drain and source, respectively.

The display sub-pixel 302 and the anti-view sub-pixel 301 share a power line, which can reduce the wiring of the display panel 10 and improve the pixel aperture ratio.

It should be noted that the second pixel driving circuit 12 also includes a storage capacitor 290, the storage capacitor 290 is configured to maintain the data voltage. In addition, the second pixel driving circuit 12 may also include a threshold voltage compensation unit or the like, depending on the case.

Embodiment II

The main difference between Embodiment II and Embodiment I is that the power lines of the anti-view sub-pixels 301 in the odd row and the anti-view sub-pixels 301 in the even row are different.

Figure 8:
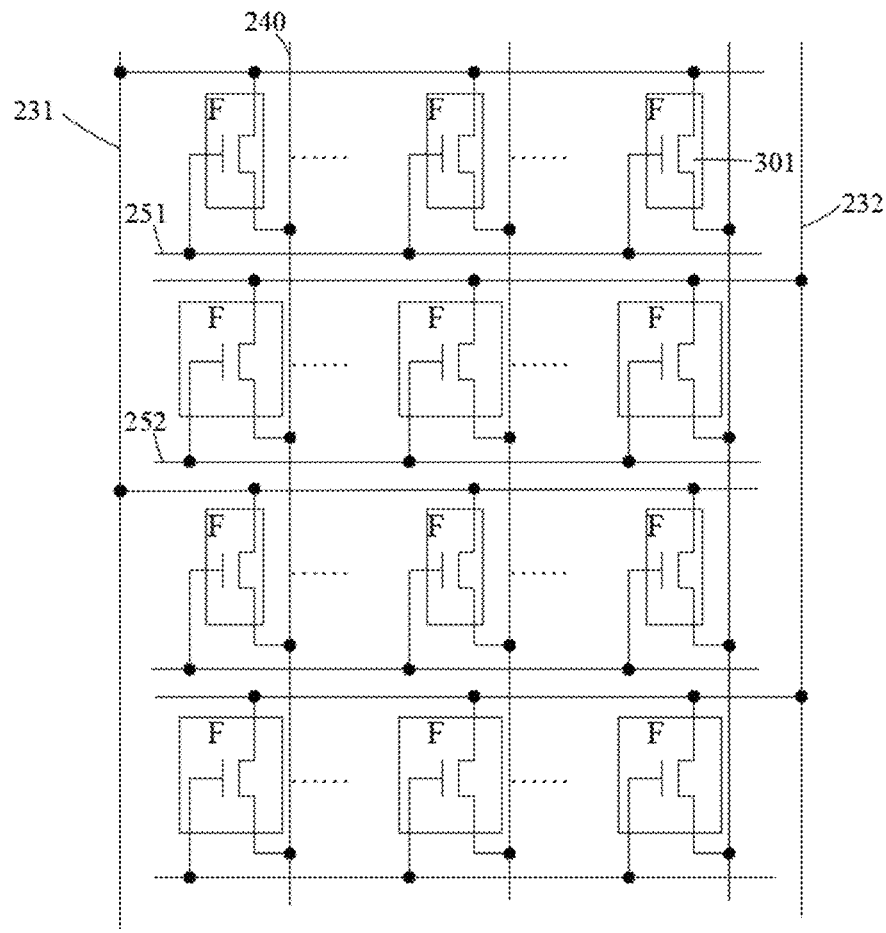
FIG. 8 is a planar structure diagram of an anti-view sub-pixel in Embodiment II of the present application.

Referring to FIG. 8, the first power line 230 includes a first power branch line 231 and a second power branch line 232, and voltages of the first power branch line 231 and the second power branch line 232 are different. For example, the voltage of the first power branch line 231 is 4V, the voltage of the second power branch line 232 is 8V, and the voltage of the second power line 240 is 0V. The first terminal 262 of the first transistor 260 in the odd row is connected to the first power branch line 231, and the first terminal 262 of the first transistor 260 in the even row is connected to the second power branch line 232.

The voltage difference between the first power line 230 and the second power line 240 affects the source-drain voltage difference of the first transistor 260 and the anode-cathode voltage difference of the anti-view sub-pixel 301, thereby affecting the magnitude of the driving current Ids. The greater the voltage of the first power line 230, the greater the source voltage Vs of the first transistor 260, the greater the driving current Ids.

If the voltage of the first power branch line 231 is different from that of the second power branch line 232, the brightness of the anti-view sub-pixels 301 in the odd row can be adjusted by the voltage of the first power branch line 231, and the brightness of the anti-view sub-pixels 301 in the even row can be adjusted by the voltage of the second power branch line 232, so that the brightness difference between the anti-view sub-pixels 301 in the odd row and the anti-view sub-pixels 301 in the even row can be increased or decreased, so as to enhance the anti-view effect of the display panel 10. Specifically, the brightness difference between the anti-view sub-pixels 301 in the odd row and the anti-view sub-pixels 301 in the even row is increased or decreased depending on the fact that whichever visual fatigue is more likely to occur.

It should be noted that the signals of the control lines 250 of all the first transistors 260 may be the same, for example, the voltage of the control line 250 of the first transistor 260 is 7V, but not limited thereto, and the control signal of the first transistor 260 may also be set in the manner disclosed in Embodiment I, depending on the specific situation. The display sub-pixel 302 may employ one of the first power branch line 231 and the second power branch line 232 as a power supply, but is not limited thereto, and the display sub-pixel 302 may also be additionally provided with a power line, depending on the case.

Embodiment III

Figure 9:
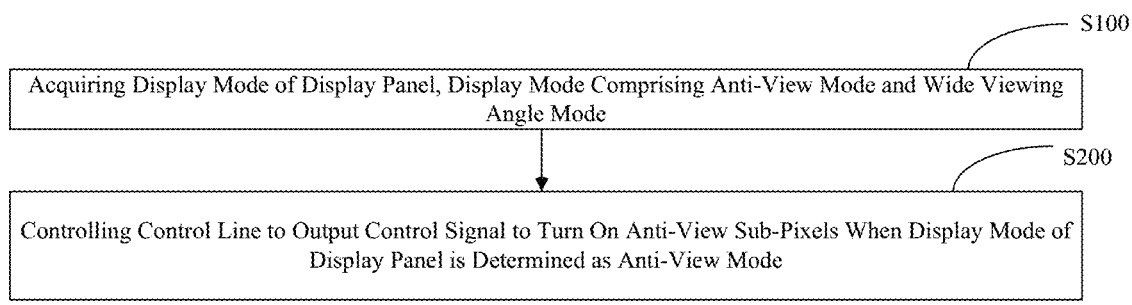
FIG. 9 is a flowchart of a display driving method in Embodiment III of the present application.

The embodiment provides a display driving method for driving a display panel 10, the display panel 10 includes the display panel 10 disclosed in Embodiments I and II. The display panel 10 includes a base substrate 100 and a plurality of pixel cells 30 arranged on the base substrate 100, the plurality of pixel cells 30 being arranged in arrays in a row direction and a column direction. At least part of the plurality of pixel cells 30 includes anti-view sub-pixels 301, each of the anti-view sub-pixels 301 includes a first anode 311, an anti-view light-emitting part 331 and a cathode 341. At least some of the anti-view light-emitting parts 331 have different areas of orthographic projection on the base substrate 100. The display panel 10 further includes a first transistor 260, a control line 250, a first power line 230 and a second power line 240, a control terminal 261 of the first transistor 260 is connected to the control line 250, a first terminal 262 of the first transistor 260 is connected to the first power line 230, a second terminal 263 of the first transistor 260 is connected to the first anode 311, and the cathode 341 is connected to the second power line 240. Referring to FIG. 9, the display driving method includes:

S100: acquiring a display mode of the display panel, the display mode comprising an anti-view mode and a wide viewing angle mode; and S200: controlling the control line 250 to output a control signal to turn on the anti-view sub-pixels 301 when the display mode of the display panel is determined as the anti-view mode.

In some embodiments, the area of the orthographic projection of the anti-view light-emitting parts 331 in the odd row on the base substrate 100 is smaller than the area of the orthographic projection of the anti-view light-emitting parts 331 in the even row on the base substrate 100. The control line 250 includes a first control line 251 and a second control line 252, a control terminal 261 of the first transistor 260 in the odd row is connected to the first control line 251, and a control terminal 261 of the first transistor 260 in even row is connected to the second control line 252. In step S200, the controlling the control line to output a control signal includes:

Both the first control line 251 and the second control line 252 are controlled to output PWM wave signals, and the waveforms of the signal of the first control line 251 and the signal of the second control line 252 are opposite.

Since the control terminal 261 of the first transistor 260 in the odd row is connected to the first control line 251, and the control terminal 261 of the first transistor 260 in the even row is connected to the second control line 252, the control lines 250 in the odd row and the even row can output control signals with opposite waveforms, so that the anti-view sub-pixels 301 in the odd row and the even row not only have different brightness, but also flash alternately. This design can cause visual fatigue when viewed obliquely, that is, enhance the anti-view effect of the display panel.

In some embodiments, the high-level voltage of the signal of the first control line 251 and the high-level voltage of the signal of the second control line 252 are different.

If the high-level voltage of the signal of the first control line 251 and the high-level voltage of the signal of the second control line 252 may also be different, the brightness of the anti-view sub-pixels 301 in the odd row may be adjusted by the signal of the first control line 251, and the brightness of the anti-view sub-pixels 301 in the even row may be adjusted by the signal of the second control line 252, so that the brightness difference between the anti-view sub-pixels 301 in the odd row and the anti-view sub-pixels 301 in the even row may be increased or decreased, so as to enhance the anti-view effect of the display panel. Specifically, the brightness difference between the anti-view sub-pixels 301 in the odd row and the anti-view sub-pixels 301 in the even row is increased or decreased depending on the fact that whichever visual fatigue is more likely to occur.

In some embodiments, the first power line 230 includes a first power branch line 231 and a second power branch line 232. The first terminal 262 of the first transistor 260 in the odd row is connected to the first power branch line 231, and the first terminal 262 of the first transistor 260 in the even row is connected to the second power branch line 232. The display driving method further includes:

controlling the first power branch line 231 and the second power branch line 232 to output different voltages when the display mode of the display panel is determined as the anti-view mode.

If the voltage of the first power branch line 231 is different from that of the second power branch line 232, the brightness of the anti-view sub-pixels 301 in the odd row can be adjusted by the voltage of the first power branch line 231, and the brightness of the anti-view sub-pixels 301 in the even row can be adjusted by the voltage of the second power branch line 232, so that the brightness difference between the anti-view sub-pixels 301 in the odd row and the anti-view sub-pixels 301 in the even row can be increased or decreased, so as to enhance the anti-view effect of the display panel. Specifically, the brightness difference between the anti-view sub-pixels 301 in the odd row and the anti-view sub-pixels 301 in the even row is increased or decreased depending on the fact that whichever visual fatigue is more likely to occur.

When the display panel works, the user selects the display mode, which includes anti-view mode and wide viewing angle mode, and the anti-view mode can be further refined into: normal light anti-view and flashing anti-view.

If the user selects the wide viewing angle mode, the first control line 251 and the second control line 252 control the first transistor 260 to be turned off, that is, the anti-view sub-pixel 301 is turned off. For the display panel in which the anti-view sub-pixel 301 and the display sub-pixel 302 are supplied independently, the first power line 230 of the anti-view sub-pixel 301 also stops supplying power.

If the user selects the normal light anti-view, the signal of the first control line 251 and the signal of the second control line 252 may both be DC signals, and the voltages of the signal of the first control line 251 and the signal of the second control line 252 are the same or different, so that the anti-view sub-pixel 301 remains on. In the normal light anti-view mode, the brightness of the anti-view sub-pixel 301 can be adjusted.

If the user selects the flashing anti-view, the signal of the first control line 251 and the signal of the second control line 252 are both PWM wave signals with opposite waveforms, and the anti-view sub-pixels 301 in the odd row and the anti-view sub-pixels 301 in the even row alternately flash and emit light. In the flashing anti-view mode, the flashing frequency and brightness of each row of anti-view sub-pixels 301 can be adjusted.

Embodiment IV

Figure 10:
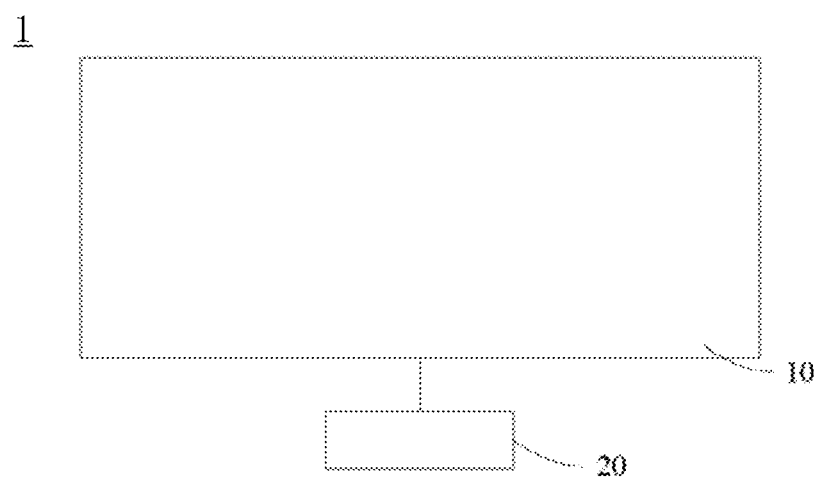
FIG. 10 is a structural schematic diagram of a display device in Embodiment IV of the present application.

Referring to FIG. 10, the display device 1 in this embodiment includes a display panel 10 and a main board 20, the main board 20 is connected to the display panel 10, and the display panel 10 includes the display panel 10 disclosed in Embodiments I and II.

The display device 1 includes the display panel 10, a scan line 210, a data line 220 and a plurality of pixel cells 30 of the display panel 10 are arranged at one side of the base substrate 100. At least part of the pixel cells 30 include at least one anti-view sub-pixel 301, and the anti-view sub-pixel 301 includes a first anode 311, an anti-view light-emitting part 331 and a cathode 341. The first pixel driving circuit 11 is coupled with a control line 250, a first power line 230 and the first anode 311, and the cathode 341 is connected to a second power line 240. At least part of the anti-view sub-pixels 301 have different areas of orthographic projection of the anti-view light-emitting parts 331 on the base substrate 100, so that brightness of the at least part of the anti-view sub-pixels 301 is different. That is to say, there are brightness changes in anti-view sub-pixels 301, which not only interfere with the acquisition of display content when viewed obliquely, but also is more likely to cause visual fatigue when viewed obliquely, which enhances the anti-view effect of display panel 10.

The terms of "first," "second" and the like are for descriptive purposes only and cannot be construed as indicating or implying relative importance or implying the number of the indicated technical features. Thus, features defined with "first", "second" and the like may explicitly or implicitly include one or more of the features. In the description of the present application, "a plurality of" means two or more, unless explicitly and specifically defined otherwise.

In the present application, unless otherwise explicitly provided and limited, the terms such as "mount," "connect," should be understood broadly, which, for example, may refer to a fixed connection, a detachable connection, or an integral connection; which may refer to a mechanical connection or an electrical connection; which may refer to a direct connection or an indirect connection via an intermediate medium; which may also refer to a communication between the insides of two elements. For those ordinarily skilled in the art, the specific meanings of the above terms in the present application will be understood according to the specific circumstances.

In the content of the description, illustrations of the reference terms "some embodiments," "example," etc. mean that specific features, structures, materials, or characteristics described in connection with the embodiment or example are encompassed in at least one embodiment or example of the present application. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may combine and incorporate different embodiments or examples described in the description and features of different embodiments or examples.

Although embodiments of the present application have been shown and described above, it will be understood that the above-mentioned embodiments are exemplary and cannot be construed as limiting the present application. Those of ordinary skill in the art may make changes, variations, alternatives and modifications to the above-mentioned embodiments within the scope of the present application. Therefore, any changes or modifications made in accordance with the claims and descriptions of the present application should fall within the scope of the patent of the present application.

What is claimed is:

1. A display driving method for driving a display panel, wherein the display panel comprises a base substrate and a plurality of pixel cells arranged on the base substrate, the plurality of pixel cells being arranged in arrays in a row direction and a column direction, wherein at least part of the plurality of pixel cells comprise anti-view sub-pixels, each of the anti-view sub-pixels comprising a first anode, an anti-view light-emitting part and a cathode, wherein at least part of the anti-view light-emitting parts have different areas of orthographic projection on the base substrate, wherein the display panel further comprises a first transistor, a control line, a first power line and a second power line, a control terminal of the first transistor being connected to the control line, a first terminal of the first transistor being connected to the first power line, a second terminal of the first transistor being connected to the first anode, and the cathode being connected to the second power line, wherein the display driving method comprises:

acquiring a display mode of the display panel, the display mode comprising an anti-view mode and a wide viewing angle mode; and controlling the control line to output a control signal to turn on the anti-view sub-pixels when the display mode of the display panel is determined as the anti-view mode;

wherein an area of an orthographic projection of each anti-view light-emitting part in an odd row on the base substrate is smaller than an area of an orthographic projection of each anti-view light-emitting part in an even row on the base substrate, wherein the first power line comprises a first power branch line and a second power branch line, wherein the first terminal of the first transistor in the odd row is connected to the first power branch line, and the first terminal of the first transistor in the even row is connected to the second power branch line, wherein the display driving method further comprises:

controlling the first power branch line and the second power branch line to output different voltages when the display mode of the display panel is determined as the anti-view mode;

wherein the anti-view mode comprises a normal light anti-view mode and a flashing anti-view mode, and controlling the first power branch line and the second power branch line to output different voltages when the display mode of the display panel is determined as the anti-view mode comprises:

controlling the first power branch line and the second power branch line to output signals with opposite waveforms when the display mode of the display panel is determined as the flashing anti-view mode.

2. The display driving method according to claim 1, wherein an area of an orthographic projection of each anti-view light-emitting part in an odd row on the base substrate is smaller than an area of an orthographic projection of each anti-view light-emitting part in an even row on the base substrate, wherein the control line comprises a first control line and a second control line, the control terminal of the first transistor in the odd row is connected to the first control line, and the control terminal of the first transistor in the even row is connected to the second control line, wherein controlling the control line to output a control signal comprises:

controlling the first control line and the second control line to output pulse width modulation (PWM) wave signals, a signal of the first control line signal and a signal of the second control line having opposite waveforms.

3. The display driving method according to claim 2, wherein a high-level voltage of the signal of the first control line is different from a high-level voltage of the signal of the second control line.

* * * * *